United States Patent
de Brébisson

(10) Patent No.: US 7,453,376 B2
(45) Date of Patent: Nov. 18, 2008

(54) METHOD, APPARATUS, AND COMPUTER-READABLE MEDIUM FOR KEY PRESS DETERMINATION

(75) Inventor: Cyrille de Brébisson, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 660 days.

(21) Appl. No.: 10/936,763

(22) Filed: Sep. 9, 2004

(65) Prior Publication Data

US 2006/0053391 A1   Mar. 9, 2006

(51) Int. Cl.
  *H03M 11/00* (2006.01)
  *H03K 17/94* (2006.01)
(52) U.S. Cl. .............. 341/24; 341/21; 341/25; 341/26; 345/168; 400/477; 400/480
(58) Field of Classification Search ........... 341/24, 341/26, 21; 340/5.51, 5.54; 708/146, 142; 715/814; 345/168; 400/477
See application file for complete search history.

(56) References Cited

U.S. PATENT DOCUMENTS

| | | | |
|---|---|---|---|
| 4,199,750 A * | 4/1980 | Taguchi | 341/26 |
| 4,381,502 A * | 4/1983 | Prame | 341/26 |
| 4,420,744 A | 12/1983 | Jesson | |
| 4,498,073 A * | 2/1985 | Fisher et al. | 341/25 |
| 5,220,323 A * | 6/1993 | Ito et al. | 341/24 |
| 5,424,730 A * | 6/1995 | Sasaki et al. | 341/25 |
| 5,552,781 A * | 9/1996 | Progar | 341/22 |
| 5,760,714 A * | 6/1998 | Zimmerman | 341/26 |

FOREIGN PATENT DOCUMENTS

DE   19723188 A1   12/1998

OTHER PUBLICATIONS

European Search Report of Patent Application No. 05255017.5—1233 mailed Apr. 29, 2008.

* cited by examiner

*Primary Examiner*—Jeffery A. Hofsass
*Assistant Examiner*—Sisay Yacob

(57) ABSTRACT

A system, method, and computer-readable medium having instructions for determining a key press from a current keyboard state at a current time is described. The system stores signals indicative of a last key press, a last key press time, and a last keyboard state. The system determines released keys and pressed keys on the keyboard at the current time based on comparison with the last keyboard state. The system determines a key press at the current time if the first determination determines a single key press and if either of: (a) a match exists between the determined key press and the last key pressed and if the elapsed time between the current time and the last key press time is larger than a preset bounce time; and (b) a match does not exist between the determined key press and the last key press.

30 Claims, 4 Drawing Sheets

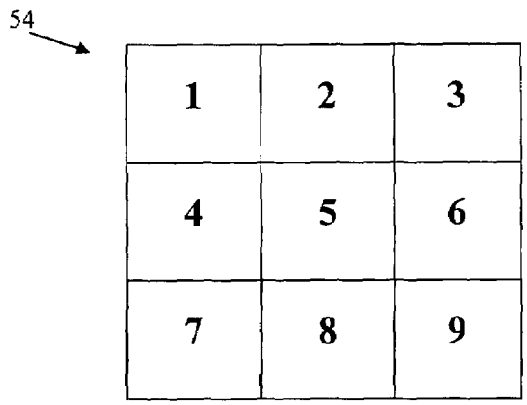

FIG. 5

| Last Keyboard State, Last Key Pressed, Time of Last Key Press | time | Action/key state | key pressed | key released | Determination |
|---|---|---|---|---|---|
| 000000000<br>-1 | 1 | Press 1<br>000000001 | 000000001 | 000000000 | Key 1 pressed |
| 000000001<br>1<br>1 | 2 | Release 1<br>000000000 | 000000000 | 000000001 | Key 1 released |
| 000000000<br>1<br>1 | 3 | Press 1<br>000000001 | 000000001 | 000000000 | Bounce detected (3-1<3) |
| 000000001<br>1<br>3 | 4 | Release 1<br>000000000 | 000000000 | 000000001 | Key 1 released |
| 000000000<br>1<br>8 | 8 | Press 1<br>000000001 | 000000001 | 000000000 | Key 1 pressed (no bounce because 8-3>=3) |
| 000000001<br>9<br>9 | 9 | Press 9<br>100000001 | 100000000 | 000000000 | Notify system key 9 pressed |
| 100000001<br>9<br>9 | 10 | Press 7<br>101000101<br>(Key 3 declared down due to ghosting) | 001000100 | 000000000 | Ghosting detected |

FIG. 4

METHOD, APPARATUS, AND COMPUTER-READABLE MEDIUM FOR KEY PRESS DETERMINATION

BACKGROUND

Due to the interconnection of keys on a keyboard, it is possible for a user key press of more than one key at a time to be erroneously detected to include a single unpressed key. It is possible for a single user key press (while other keys are depressed) to be perceived by the system as if the user had depressed more than one key simultaneously, i.e., the key pressed by the user and one or more additional keys. More specifically, a user key press of multiple keys at a time causes a signal path to be created in the keyboard such that a signal driven to detect a key press is received by an additional incorrect receiver indicative of a different key press than that pressed by the user. The receipt of a key press signal as a result of this type of occurrence is called a "key ghost."

With respect to the key ghosting problem, prior solutions include forbidding users to press more than two keys of a keyboard at the same time.

Additionally, due to the construction and operation of the keys on the keyboard, a user key press may cause a key press to register as two key presses as the key moves back down due to an elastic reaction, e.g., movement of a mechanical spring against the key, and completes a contact on the keyboard for the duration of the user key press. That is, a key press results in detection of multiple key presses as a result of what is known as a "key bounce." Different keyboards have different key bounce times due to the strength of the elastic mechanism for returning the key to its original position prior to a user key press.

With respect to the key bouncing problem, prior solutions include performing multiple keyboard key press detections in order to ensure stability of a received signal indicative of a key press; however, this approach slows down the detection system and the key press detection. Another prior solution included using electrical means, e.g., a capacitor, attached to each key on the keyboard in order to "debounce" the keys. However, this solution increases the cost of the keyboard in terms of component and manufacturing costs.

SUMMARY

The present invention provides a method for key press determination.

A method aspect includes determining a key press from a current keyboard state based on a current time, a last key pressed, a last key press time, and a last keyboard state. Which keys on the keyboard have been released at the current time and which keys have been pressed at the current time is determined based on a comparison with the last keyboard state. If a single key is determined to have been pressed at the current time, then if either one of (a) there exists a match between the key pressed at current time and the last key pressed and if the elapsed time between the key pressed at the current time and the last key press time is larger than a preset bounce time; and (b) a discrepancy is found between the key pressed at the current time and the last key pressed, then the single key pressed at the current time is reported.

A system aspect for determining a key press from a current keyboard state includes a signal storing means, a signal receiving means, a first determining means, and a second determining means. The signal storing means stores signals indicative of a last key press, a last key press time, and a last keyboard state. The signal receiving means receives signals indicative of a current keyboard state and a current time. The first determining means determines: (a) which keys on the keyboard have been released at the current time and (b) which keys on the keyboard have been pressed at the current time based on comparison with the last keyboard state. The second determining means determines a key press at the current time if the first determining means determines a single key press at the current time and if either of: (a) there exists a match between the key press at the current time and the last key pressed and if the elapsed time between the key press and the current time and the last key press time is larger than a preset bounce time; and (b) there does not exist a match between the key press at the current time and the last key press.

A computer-readable medium aspect includes at least one sequence of instructions. Execution of the instructions by a computer causes the computer to determine which keys on a keyboard have been released at a current time based on comparing a current keyboard state with a last keyboard state and determine which keys on a keyboard have been pressed at the current time based on comparing the current keyboard state with the last keyboard state. Execution of the instructions by the computer causes the computer to determine a key press at the current time if a single key press at the current time is determined based on the foregoing comparison of the current keyboard state with the last keyboard state and if either of: (a) there exists a match between the key press at the current time and a last key press and if the elapsed time between the key press at the current time and a last key press time is larger than a preset bounce time; and (b) there does not exist a match between the key press at the current time and the last key press.

A key detect system aspect includes a processor for receiving signals indicative of a current keyboard state and a memory coupled to the processor. The memory stores a last key press, a last key press time, a last keyboard state, and sequences of instructions which, when executed by the processor, cause the processor to determine a key press on the keyboard. Execution of the instructions by the processor causes the processor to (i) determine which keys on the keyboard have been released and which keys on the keyboard have been pressed based on comparing the current keyboard state and the last keyboard state, and (ii) determine a key press if the (i) determination determines a single key press and either of: (a) a match exists between the key press and the last key pressed, and the elapsed time between the key press and the last key press time is larger than a preset bounce time; and (b) a match does not exist between the key press and the last key press.

Still other advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 4 is a state table of an exemplary operation of an embodiment according to the present invention;

FIG. 5 is a diagram of a matrix of keys on a keyboard; and

DETAILED DESCRIPTION

Figure 1:
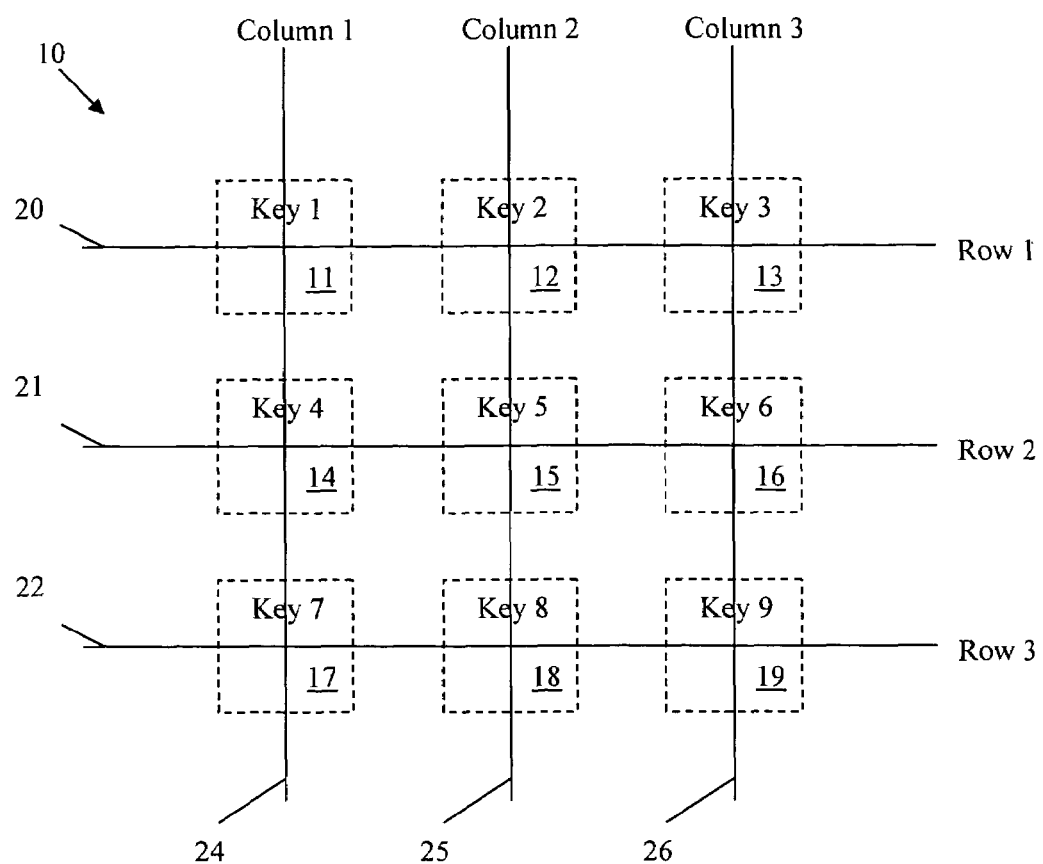
FIG. 1 is a diagram of a portion of a keyboard useable in conjunction with an embodiment according to the present invention.

A portion of a keyboard useable in conjunction with an embodiment according to the present invention is depicted generally at 10 in FIG. 1. Although keyboard portion 10 is part of a keyboard, only a portion is depicted and described with respect to FIG. 1 for clarity.

The term "keyboard" as used herein, is considered to mean, and include, any set of keys laid out in an interconnected fashion, e.g. a row or rows, a column or columns, etc. Examples of "keyboards" include, but are not limited to computer keyboards, typewriter keyboards, electronic instrument keyboards, and various types of keypads such as numeric and alphanumeric keypads.

In the example keyboard 10 depicted in FIG. 1, key one through key nine 11-19 form a portion of the keyboard and are arranged in a table format having a plurality of row interconnection lines 20-22 and a plurality of column interconnection lines 24-26. Each of the interconnection lines 20-22 and 24-26 interconnects a corresponding sequence of keys, e.g., interconnection line 20 interconnects the sequence of keys forming row 1 of keyboard 10, that is, keys 11-13. Interconnection line 21 interconnects the sequence of keys forming row 2 of keyboard 10, i.e. keys 14-16, and interconnection line 22 interconnects the sequence of keys forming row 3 of keyboard 10, i.e. keys 17-19. Similarly, interconnection line 24 interconnects the sequence of keys forming column 1 of keyboard 10, i.e. keys 11, 14, and 17, interconnection line 25 interconnects the sequence of keys forming column 2, i.e., keys 12, 15, and 18, and interconnection line 26 interconnects the sequence of keys forming column 3, i.e., keys 13, 16, and 19.

Key one through key nine 11-19 position at the intersection of respective rows and columns such that activation of a particular key, i.e., such as a key press, causes an interconnection of the row and column at which the particular key is positioned. For example, a user pressing key 14 causes an interconnection between row interconnect line 21 and column interconnect line 24 and thereby enables the transmission of a signal from a row to a column. Continuing with the present example, to detect the user key press of key 14, a signal driven along each of the row interconnect lines 20-22 by transmitter is only received by a receiver connected to column interconnection lines 24-26 if a particular key is pressed completing the interconnection of a row and a column. Because a signal is driven along each of row interconnect lines 20-22 in an ordered fashion, the particular row interconnect line driving a signal received at a column interconnect line 24-26 is known and the particular key pressed may be determined therefrom.

The term "signal" as used herein is considered to mean, and include, any electromagnetic signal capable of propagation through a medium from row interconnect lines to column interconnect lines. Examples of "signals" include, but are not limited to electrical and optical signals.

An embodiment according to the present invention overcomes a particular problem with respect to keyboards such as keyboard 10. The problem is called "ghosting" and res7lts in the erroneous detection of a key press in a particular scenario where multiple keys are pressed on keyboard 10. For example, if a user holds keys 11, 14, and 15 depressed at substantially the same time, a system reading column outputs based on driving a signal along row interconnection lines 20-22 erroneously reports keys 12 as having been depressed by the user.

Another embodiment according to the present invention overcomes another particular problem with respect keyboard's such as keyboard 10. The problem is called "keyboard bouncing" and results in the erroneous multiple detection of a key press as a result of a single key press.

Figure 2:
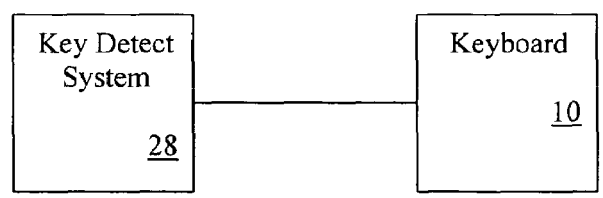
FIG. 2 is high level diagram of a key detect system and keyboard in one embodiment according to the present invention.

In one embodiment according to the present invention as depicted in FIG. 2, a key detect system 28, connected to keyboard 10 and able to cause a signal to be driven along row interconnect lines 20-22 and able to detect a user key press by receipt of the same signal at column interconnect lines 24-26 as described above, only reports correct key presses. That is, key detect system 28 detects and does not report erroneous key presses such as ghost keys and/or bouncing keys.

Key detect system 29 can be implemented in hardware (e.g., using circuits such as registers, logic gates, and the like) or software using one or more processors, programmable instructions. In one preferred embodiment, key detect system 29 includes a computer or other processor based system capable of performing a sequence of logic operations. In addition, key detect system 29 can include a processor embedded system/appliance incorporating tailored appliance hardware and/or dedicated single purpose hardware.

In operation according to one embodiment of the present invention, key detect system 28 stores a value indicative of a last known keyboard state representing which keys were pressed and which were released on keyboard 10, a value indicative of a last known key press on keyboard 10, and a value indicative of the time the last known key press was detected. As described above, key detect system 28 determines the current keyboard state of keyboard 10, as well as the keys which have been released and any new keys pressed on the keyboard. Key detect system 28 stores the current keyboard state as the last known keyboard state. If no new keys were pressed on keyboard 10 or more than one new key was pressed on keyboard 10, then key detect system 28 determines that no key press has occurred. If only one new key was pressed on keyboard 10 and there is a match between the new key pressed and the last known key press, then key detect system 28 determines that a key press has occurred and stores (1) the new key press as the last known key press and (2) the current time as the time of the last known key press. Further, if only one new key was pressed on keyboard 10 and the elapsed time between the current time and the last known key press time is larger than a preset bounce time, then key detect system 28 determines that a key press has occurred and stores (1) the new key press as the last known key press and (2) the current time as the time of the last known key press. However, if only one new key was pressed on keyboard 10 and the elapsed time between the current time and the last known key press time is smaller than a preset bounce time, then key detect system 28 determines that a key bounce has occurred and stores the current time as the time of the last known key press.

The preset key bounce time, or preset bounce time, is determined by the particular keyboard components and varies from keyboard to keyboard. Preset bounce time is considered to represent the maximum amount of time within which a key press of a single key on the keyboard should be detected as a single key press. That is, preset bounce time is the maximum length of time during which a keyboard key has been detected to bounce. In one embodiment, the preset bounce time includes an additional safety margin time.

In one embodiment, if the elapsed time between the current time and the last known key press time is equal to the preset bounce time, the key detect system 28 determines that a key bounce has occurred and stores the current time as the time of the last known key press. In an alternate embodiment, if the elapsed time equals the preset bounce time, the key detect system 28 determines that a key bounce has not occurred, determines that a key press has occurred and stores the new key press as the last known key press and stores the current time as the time of the last known key press.

Figure 3:
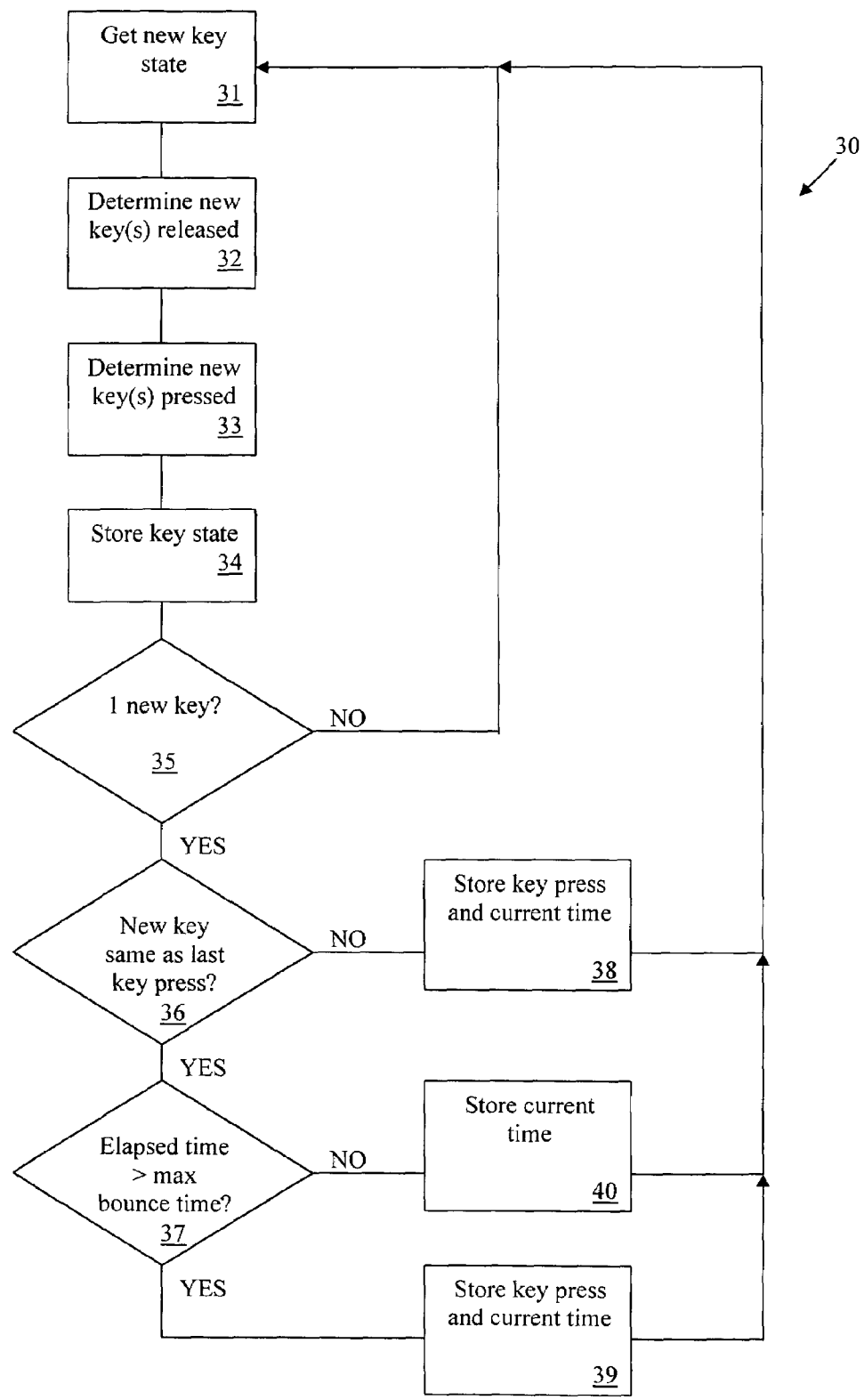
FIG. 3 is process flow diagram of an embodiment according to the present invention.

FIG. 3 depicts a process flow diagram of a flow of control 30 representing operation of key detect system 28 described above. Flow control 30 is now described in detail. Flow of control 30 begins at step 31 wherein key detect system 28 determines a new key state of keys 11-19 of keyboard 10. Key detect system 28 proceeds to perform step 32 and determines a list of new keys released by comparing the new keyboard state from step 31 with a last known keyboard state. In one particular embodiment, key detect system 28 performs a logical AND operation between a binary representation of the last known keyboard state and a one's complement of a binary representation of the new keyboard state.

Proceeding to perform step 33, key detect system 28 determines a list of new keys pressed by comparing the new keyboard state from step 31 with the last known keyboard state. In one particular embodiment, key detect system 28 performs a logical AND operation between a binary representation of the new keyboard state and a one's complement of a binary representation of the last known keyboard state. Key detect system 28 proceeds to perform step 34 and saves the new keyboard state as the last known keyboard state.

Flow of control 30 proceeds to decision step 35 wherein key detect system 28 determines if only one new key was pressed at keyboard 10 based on the result of step 33. If only one new key was pressed the flow of control proceeds to decision step 36; however, no new keys were pressed or more than one new keys was pressed the flow of control proceeds to return to step 31 because either no new key has been pressed or a ghost key press has been determined to have occurred.

Returning now to decision step 36, key detect system 28 determines if there is a match between the new key pressed and the last known key press. If there is a match the flow of control proceeds to decision step 37; however, if no match is detected the flow of control proceeds to step 38 wherein key detect system 28 stores the new key press as the last known key press and stores the current time as the last known key press time. Continuing along the no match detected flow of control, key detect system 28 proceeds to return to step 31. In another embodiment, key detect system 28 reports the new key press to another system (not shown) during step 38.

Returning now to decision step 37, key detect system 28 determines if the elapsed time between the current time and the last known key press time is greater than a preset value indicative of a maximum bounce time for keys on keyboard 10. If the elapsed time is greater than the preset value the flow of control proceeds to step 39; however, if the elapsed time is not greater than the preset value the flow control proceeds to step 40 wherein key detect system 28 stores the current time as the last known key press time because a key bounce has been determined to have occurred. Key detect system 28 proceeds from step 40 to return to step 31.

Returning now to step 39, key detect system 28 stores the current time as the time of the last known key press and the new key press as the last known key press. Key detect system 28 proceeds from step 39 to return to step 31. In another embodiment, key detect system 28 reports the new key press to another system (not shown) during step 39.

FIG. 4 depicts a state table 40 related to an exemplary operation of an embodiment according to the present invention wherein a sequence of keys on keyboard 10 are pressed by a user. State table 40 includes a first column 41 depicting values of the last known keyboard state, the last known key press, and the time of the last key press stored in a respective data structure. For the purposes of this example only, the data structure is a sequence of binary digits equal in length to the number of keys in keyboard 10 and the preset bounce time is 3. The rightmost binary digit of the column values corresponds to the state of the first key in a keyboard matrix 54 as depicted in FIG. 5. Each binary digit to the left of the rightmost binary digit corresponds to the next incremental key in keyboard matrix 54. Each row of values in state table 40 the values as time proceeds downward along the page. Values in second column 42 of state table 40 depicts the time for each row entry. Third column 43 depicts the action which occurred, e.g., which key on keyboard 10 was pressed, and the new keyboard state as a result of the action. Fourth column of 44 and fifth column 45 depict a value stored in a key pressed and key released data structure, respectively. Sixth column 46 depicts a determination by key detect system 28 regarding a key press, key release, bounce detection, or ghost detection based on the first column 41 values, fourth column 44 values, and fifth column 45 values for the instant row entry.

At the beginning of the example operation, row entry 47 depicts the values of the columns based on a user action of pressing key 1 of keyboard matrix 54 at a time 1. Based on the column values for row entry 47, key detect system 28 determines, using the above described flow of control, that one key was pressed, no new keys were released, and the key pressed was key 1 of keyboard matrix 54. Row entry 48 depicts the values of the columns based on a user action of releasing key 1 of keyboard matrix 54 at a time 2. Based on the column values of row entry 48, key detect system 28 determines that one key was released, no new keys were pressed, and the key released was key 1 of keyboard matrix 54.

Row entry 49 depicts the values of the columns based on a user action of pressing key 1 of keyboard matrix 54 at a time 3. Based on the column values of row entry 49, key detect system 28 determines that one key was pressed and that the key press was the result of a key bounce.

Row entry 50 depicts the values of the columns based on a user action of releasing key 1 of keyboard metrics 54 at a time 3. Based on the column values of row entry 50, key detect system 28 determines that one key was released and no new keys were pressed.

Row entry 51 depicts the values of the columns based on a user action of pressing key 1 of keyboard matrix 54 at a time 8. Based on the column values of row entry 51, key detect system 28 determines that one key was pressed, new keys were released. A key bounce is not detected because the elapsed time between the current time and the time the last key was pressed is greater than a preset bounce time, i.e., 8−3>3.

Row entry 52 depicts the values of the columns based on a user action of pressing key 9 of keyboard matrix 54 at a time 9. Based on the column values of row entry 52, key detect system 28 determines that one key was pressed, no keys were released, and a key pressed was key 9 of keyboard matrix 54.

Row entry 53 depicts the values of columns based on a user action of pressing key 7 of keyboard matrix 54 at a time 10. Based on the column values of row entry 53, key detect system 28 determines that a key ghosting has occurred because more than one new key was detected as pressed.

Figure 6:
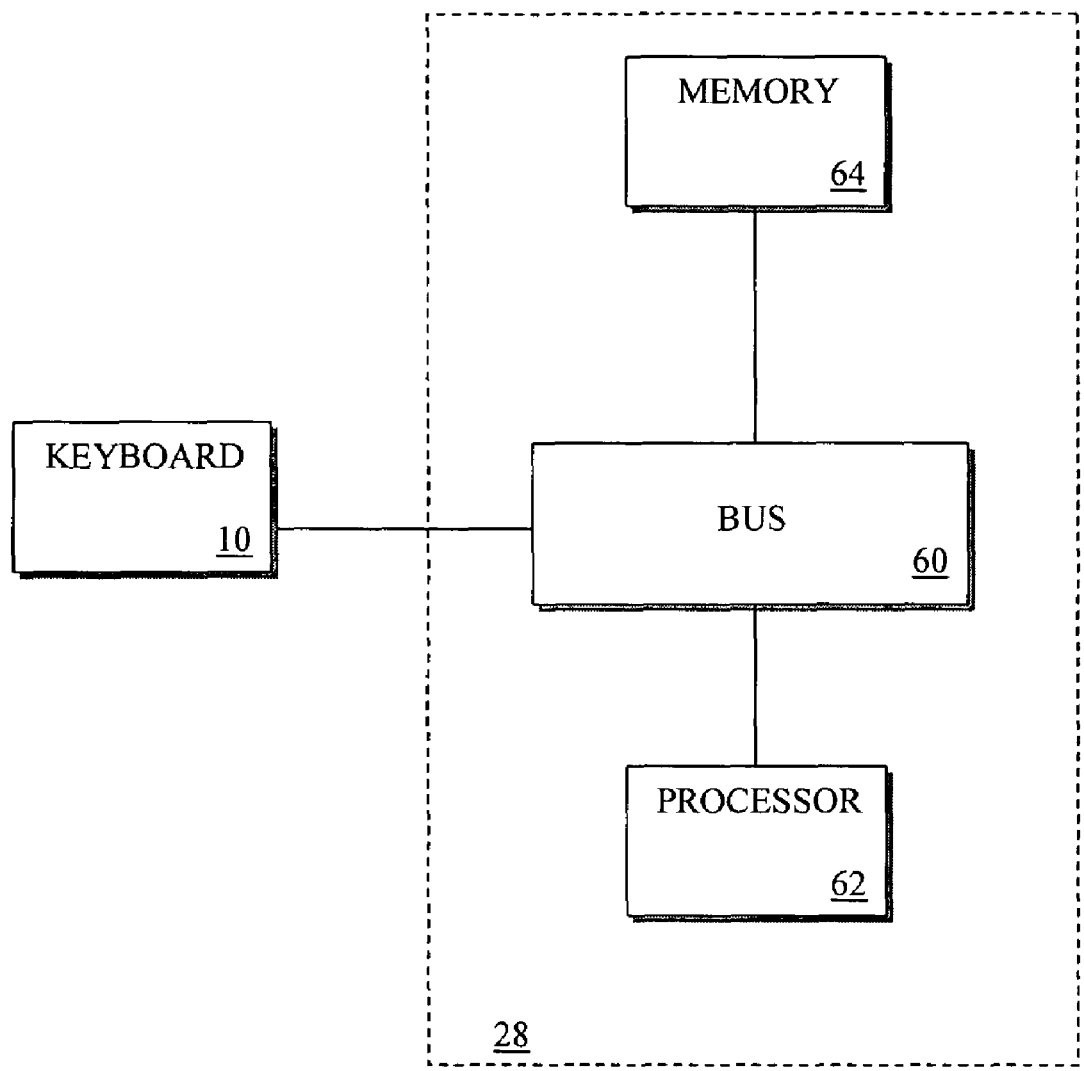
FIG. 6 is a high level block diagram of an exemplary system upon which an embodiment may be implemented.

FIG. 6 depicts a high-level block diagram of an exemplary system upon which an embodiment of key detect system 28 may be implemented. Key detect system 28 may be implemented in many ways, e.g., as a stand-alone unit connectable to keyboard 10, as an integrated part of keyboard 10, as a part of a computer system, or another combination thereof.

Key detect system 28 includes a bus 60 or other communication mechanism for communicating information, and a processor 62 coupled with the bus 60 for processing information. Key detect system 28 also includes a memory 64, such as a random access memory (RAM) or other dynamic storage device, coupled to the bus 60 for storing data and instructions to be executed by processor 62. Memory 64 also may be used for storing temporary variables or other intermediate information during execution of instructions to be executed by processor 62.

In an alternate embodiment, processor 62 includes memory sufficient to store instructions and data required to implement the above-described embodiments of the present invention and therefore memory 64 may not be required in the alternate embodiment. Additionally, in a further alternate embodiment, processor 62 may be hardwired or otherwise connected to, or a part of, keyboard 10 such that bus 60 and memory 64 are not required to practice the above-described embodiments.

An embodiment according to the present invention is related to the use of key detect system 28, such as the illustrated system of FIG. 6, to detect and determine a key press by a user on keyboard 10. According to one embodiment, user key presses on keyboard 10 are determined by key detect system 28 in response to processor 62 executing sequences of instructions contained in memory 64.

It is to be understood that even though a particular number of keys are depicted and described with respect to FIG. 1, these are only representative in nature and are not intended to be restrictive of the scope of embodiments according to the present invention.

It will be readily seen by one of ordinary skill in the art that embodiments according to the present invention fulfills many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. A method of determining a key press from a current keyboard state based on a current time, a last key pressed, a last key press time, and a last keyboard state, the method comprising the steps of:
   (i) determining which keys on the keyboard have been released at the current time based on comparison with the last keyboard state;
   (ii) determining which keys on the keyboard have been pressed at the current time based on comparison with the last keyboard state; and
   (iii) if step (ii) determines a single key pressed at the current time, then:
      if there exists a match between the key pressed at the current time and the last key pressed, then:
         if the elapsed time between the key pressed at the current time and the last key press time is larger than a preset bounce time, then:
            (a) determining the key pressed at the current time;
      if a discrepancy is found between the key pressed at the current time and the last key pressed, then:
         (b) determining the key pressed at the current time.

2. The method as claimed in claim 1, wherein step (i) comprises logically combining the current keyboard state and the last keyboard state.

3. The method as claimed in claim 1, wherein step (ii) comprises logically combining the current keyboard state and the last keyboard state.

4. The method as claimed in claim 1, further comprising the step of:
   if step (iii) determines a key press at the current time, reporting the key press.

5. The method as claimed in claim 1, wherein step (b) comprises:
   setting the last key pressed to the determined key press at the current time; and
   setting the last key press time to the current time.

6. The method as claimed in claim 1, wherein step (a) comprises:
   setting the last key pressed to the determined key press at the current time; and
   setting the last key press time to the current time.

7. The method as claimed in claim 1, wherein step (iii) further comprises:
   if there exists a match between the key pressed at the current time and the last key pressed, then:
      if the elapsed time between the key pressed at the current time and the last key press time is smaller than a preset bounce time, then:
         (c) setting the last key press time to the current time.

8. The method as claimed in claim 1, further comprising:
   (iv) reporting released keys determined by step (i).

9. A system for determining a key press from a current keyboard state, comprising:
   signal storing means for storing signals indicative of a last key press, a last key press time, and a last keyboard state;
   signal receiving means for receiving signals indicative of a current keyboard state and a current time;
   first determining means for determining: (a) which keys on the keyboard have been released at the current time and (b) which keys on the keyboard have been pressed at the current time based on comparison with the last keyboard state; and
   second determining means for determining a key press at the current time if the first determining means determines a single key press at the current time and if either of: (a) there exists a match between the key press at the current time and the last key pressed and if the elapsed time between the key press at the current time and the last key press time is larger than a preset bounce time; and (b) there does not exist a match between the key press at the current time and the last key press.

10. The system as claimed in claim 9, wherein the first determining means comparison comprises logically combining the current keyboard state and the last keyboard state.

11. The system as claimed in claim 9, further comprising reporting means for reporting a key press determined by the second determining means.

12. The system as claimed in claim 9, wherein the second determining means, responsive to an affirmative result from (b), sets the last key pressed to the determined key press at the current time and sets the last key press time to the current time.

13. The system as claimed in claim 9, wherein the second determining means, responsive to an affirmative result from (a), sets the last key pressed to the determined key press at the current time and sets the last key press time to the current time.

14. The system as claimed in claim 9, wherein the second determining means sets the last key press time to the current time if there exists a match between the key pressed at the current time and the last key pressed and if the elapsed time between the key pressed at the current time and the last key press time is smaller than a preset bounce time.

15. The system as claimed in claim 9, further comprising reporting means for reporting released keys determined by the first determining means.

16. A computer-readable medium comprising:
at least one sequence of instructions, wherein execution of the instructions by a computer causes the computer to:
(i) determine which keys on a keyboard have been released at a current time based on comparing a current keyboard state with a last keyboard state;
(ii) determine which keys on a keyboard have been pressed at the current time based on comparing the current keyboard state with the last keyboard state; and
(iii) determine a key press at the current time if step (ii) determines a single key press at the current time and if either of: (a) there exists a match between the key press at the current time and a last key press and if the elapsed time between the key press at the current time and a last key press time is larger than a preset bounce time; and (b) there does not exist a match between the key press at the current time and the last key press.

17. The medium as claimed in claim 16, wherein the instructions for step (i) comprise instructions to logically combine the current keyboard state and the last keyboard state.

18. The medium as claimed in claim 16, wherein the instructions for step (ii) comprise instructions to logically combine the current keyboard state and the last keyboard state.

19. The medium as claimed in claim 16, wherein the instructions further comprises instructions for causing the computer to:
report a key press determined by step (iii).

20. The medium as claimed in claim 16, wherein the instructions further comprises instructions for causing the computer to:
report a key release determined by step (i).

21. The medium as claimed in claim 16, wherein the step (iii) instructions further comprise instructions for causing the computer to:
responsive to an affirmative result from step (b), set the last key pressed to the determined key press at the current time and set the last key press time to the current time.

22. The medium as claimed in claim 16, wherein the step (iii) instructions further comprise instructions for causing the computer to:
responsive to an affirmative result from step (a), set the last key pressed to the determined key press at the current time and set the last key press time to the current time.

23. The medium as claimed in claim 16, wherein the step (iii) instructions further comprise instructions for causing the computer to:
set the last key press time to the current time if there exists a match between the key pressed at the current time and the last key pressed and if the elapsed time between the key pressed at the current time and the last key press time is smaller than a preset bounce time.

24. A key detect system for determining a key press on a keyboard connected thereto comprising:
a processor for receiving signals indicative of a current keyboard state; and
a memory coupled to the processor, the memory having stored therein a last key press, a last key press time, a last keyboard state, and sequences of instructions which, when executed by the processor, cause the processor to (i) determine which keys on the keyboard have been released and which keys on the keyboard have been pressed based on comparing the current keyboard state and the last keyboard state, and (ii) determine a key press if the (i) determination determines a single key press and either of: (a) a match exists between the key press and the last key pressed, and the elapsed time between the key press and the last key press time is larger than a preset bounce time; and (b) a match does not exist between the key press and the last key press.

25. The key detect system as claimed in claim 24, wherein the instructions for the (i) determination comprise instructions to logically combine the current keyboard state and the last keyboard state.

26. The key detect system as claimed in claim 24, wherein the memory further comprises instructions for causing the key detect system to report a key press determined by the (ii) determination.

27. The key detect system as claimed in claim 24, wherein the memory further comprises instructions for causing the key detect system to report a key release determined by the (i) determination.

28. The key detect system as claimed in claim 24, wherein the instructions for the (ii) determination, responsive to an affirmative result from step (b), cause the processor to set the last key pressed to the determined key press and set the last key press time to a current time.

29. The key detect system as claimed in claim 24, wherein the instructions for the (ii) determination, responsive to an affirmative result from step (a), cause the processor to set the last key pressed to the determined key press and set the last key press time to a current time.

30. The key detect system as claimed in claim 24, wherein the instructions for the (ii) determination cause the processor to set the last key press time to the current time if there exists a match between the key pressed and the last key pressed and if the elapsed time between the key pressed and the last key press time is smaller than a preset bounce time.

* * * * *

UNITED STATES PATENT AND TRADEMARK OFFICE
CERTIFICATE OF CORRECTION

PATENT NO. : 7,453,376 B2  Page 1 of 1
APPLICATION NO. : 10/936763
DATED : November 18, 2008
INVENTOR(S) : Cyrille de Brébisson It is certified that error appears in the above-identified patent and that said Letters Patent is hereby corrected as shown below:

In column 4, line 3, delete "res71ts" and insert -- results --, therefor.

In column 4, line 24, delete "29" and insert -- 28 --, therefor.

In column 4, line 26, after "programmable" insert -- logic devices, or other finite state machines implemented with programmable --.

In column 4, line 28, delete "29" and insert -- 28 --, therefor.

In column 4, line 30, delete "29" and insert -- 28 --, therefor.

Signed and Sealed this

Thirty-first Day of March, 2009

JOHN DOLL
*Acting Director of the United States Patent and Trademark Office*